(12) United States Patent
Choe et al.

(10) Patent No.: US 7,962,016 B2
(45) Date of Patent: Jun. 14, 2011

(54) HEATING CRUCIBLE FOR ORGANIC THIN FILM FORMING APPARATUS

(75) Inventors: Yun Soo Choe, Ulsan (KR); Ok Keun Song, Ulsan (KR); Hyung Min Kim, Seoul (KR); Takashi Ujihara, Saitama-ken (JP); Takeo Wakimoto, Kanakawa-ken (JP); Naofumi Hashimoto, Tokyo (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 437 days.

(21) Appl. No.: 10/652,493

(22) Filed: Sep. 2, 2003

(65) Prior Publication Data

US 2004/0042770 A1 Mar. 4, 2004

(30) Foreign Application Priority Data

Sep. 3, 2002 (KR) .................. 10-2002-0052898

(51) Int. Cl.
  *C23C 14/00* (2006.01)
  *C23C 16/00* (2006.01)
(52) U.S. Cl. .................................. 392/389; 118/726
(58) Field of Classification Search .............. 392/386, 392/387, 388, 389; 219/543, 544, 546, 547, 219/548; 118/726; 432/262
See application file for complete search history.

(56) References Cited

U.S. PATENT DOCUMENTS

| | | | | |
|---|---|---|---|---|
| 2,799,764 A | * | 7/1957 | Chandler | 392/435 |
| 3,811,900 A | * | 5/1974 | Fassell | 501/96.4 |
| 3,842,241 A | * | 10/1974 | Isaacson et al. | 392/444 |
| 4,217,855 A | * | 8/1980 | Takagi | 118/719 |
| 4,804,823 A | * | 2/1989 | Okuda et al. | 219/553 |
| 5,034,200 A | * | 7/1991 | Yamashita et al. | 117/213 |
| 5,075,055 A | | 12/1991 | Finicle | |
| 5,100,526 A | | 3/1992 | Ito | |
| 5,157,240 A | * | 10/1992 | Chow | 219/444.1 |
| 5,221,829 A | * | 6/1993 | Yahav et al. | 219/448.11 |
| 5,233,166 A | * | 8/1993 | Maeda et al. | 219/552 |
| 5,656,077 A | * | 8/1997 | Kawase | 117/200 |
| 5,728,223 A | * | 3/1998 | Murakami et al. | 118/715 |
| 6,024,799 A | * | 2/2000 | Chen et al. | 118/715 |
| 6,162,300 A | * | 12/2000 | Bichrt | 118/726 |
| 6,242,719 B1 | * | 6/2001 | Kano et al. | 219/444.1 |
| 6,296,894 B1 | * | 10/2001 | Tanabe et al. | 427/8 |

FOREIGN PATENT DOCUMENTS

CN 1057492 1/1992

(Continued)

OTHER PUBLICATIONS

Office Action issued ion Nov. 24, 2006, in Chinese Patent Application No. 031255159 (with English translation).

(Continued)

*Primary Examiner* — Sang Y Paik
(74) *Attorney, Agent, or Firm* — Christie, Parker & Hale, LLP

(57) ABSTRACT

Provided is a heating crucible for an organic thin film forming apparatus, the heating crucible including a main body in which to contain an organic substance, a cover provided on the main body, the cover formed of an insulating material and having a nozzle through which a gaseous organic substance comes out from the main body, a cover heater formed as a thin film type on the top surface of the cover, and a body heater heating the main body.

1 Claim, 4 Drawing Sheets

FOREIGN PATENT DOCUMENTS

| | | |
|---|---|---|
| CN | 1058091 | 1/1992 |
| CN | 1103112 | 5/1995 |
| CN | 1104758 | 7/1995 |
| CN | 466219 | 2/2009 |
| JP | 3-177562 | 8/1991 |
| JP | 5-503317 | 6/1993 |
| JP | 7-157868 | 6/1995 |
| JP | 10-195639 | 7/1998 |
| JP | 2000-12218 | 1/2000 |
| JP | 2000-68055 | 3/2000 |
| JP | 2000-160328 | 6/2000 |
| JP | 2000-223269 | 8/2000 |

OTHER PUBLICATIONS

Chinese Office Action issued on Nov. 16, 2007, in Chinese Patent Application No. 03125515.9 (in Chinese with English translation).

Korean Office Action issued on Aug. 27, 2008, in Korean Patent Application No. 2002-52898 (in Korean, no English Translation).

Japanese Office Action dated Oct. 6, 2009, issued in corresponding Japanese Patent Application No. 2003-311324.

* cited by examiner

HEATING CRUCIBLE FOR ORGANIC THIN FILM FORMING APPARATUS

CROSS-REFERENCE TO RELATED APPLICATIONS

This application claims priority from Korean Patent Application No. 2002-52898, filed on Sep. 3, 2002, in the Korean Intellectual Property Office, the disclosure of which is incorporated herein in its entirety by reference.

BACKGROUND OF THE INVENTION

1. Field of the Invention

The present invention relates to a heating crucible for use in an organic thin film forming apparatus, and, more particularly, to a heating crucible for use in an organic thin film forming apparatus that has a thin-layered heater on its external surface.

2. Description of the Related Art

In general, organic electroluminescent (EL) devices include an anode layer and a cathode layer which are formed on a substrate in a predetermined pattern orthogonal to one another, with a plurality of organic layers, including a hole transporting layer, an emissive layer, and an electron transporting layer, sequentially interposed between the anode layer and the cathode layer.

In an organic EL device having such a structure as described above, a vacuum deposition technique is widely known to be suitable for forming organic thin films such as the hole transporting layer, the emissive layer, and the electron transporting layer. The vacuum deposition technique involves loading a substrate, on which a thin film is to be formed, in a vacuum chamber of $10^{-6}$-$10^{-7}$ torr and vaporizing or sublimating an organic substance contained in a heating crucible to deposit an organic thin film on the substrate.

In the vacuum deposition method, the heating crucible, as a container of the organic substance to be deposited and as a heater for vaporizing or sublimating the organic substance, directly affects the condition of the organic thin film deposited from the organic substance. For this reason, active research on the heating crucible has been conducted recently.

FIGS. 1 and 2 show two types of conventional heating crucibles widely used in an organic thin film forming apparatus. FIG. 1 shows an open-style heating crucible 10, including a main body 11 having a mouth 12 at the top thereof, and a heater 13 surrounding the outer wall of the main body 11. Examples of such an open-style heating crucible are disclosed in various documents. According to the disclosure of Japanese Laid-open Patent No. 2000-223269, a plurality of small heating crucibles having small openings are used in order to improve the uniformity of an organic thin film. Japanese Laid-open Patent No. 2000-12218 discloses a technique of improving the uniformity in thickness of an organic thin film by using a heating crucible with a heater equipped to contact the outer wall of the crucible, in which the deposition rate is detected and controlled to ensure stable film deposition for a long duration. Japanese Laid-open Patent No. 2000-68055 discloses a heating crucible with two heaters: one equipped to contact the external side and bottom walls of a main body, and the other one protruding from the bottom of the main body. Japanese Laid-open Patent No. 2000-160328 discloses a heating crucible capable of improving the uniformity of an organic thin film deposited, in which a thermal reflecting member is arranged facing a heater equipped to surround a main body.

However, practically, organic thin films deposited on a substrate using such open-style heating crucibles, that are fully opened upward, have poor uniformity. For this drawback, although improving film uniformity has been one focus of research related to open-style heating crucibles as in the above-described patents, there is a limitation due to their open structure. In addition, open-style heating crucibles consume a large amount of organic substance 14 and raise costs, so it is difficult to use them for the mass production of EL devices.

Another style of a heating crucible used in an organic thin film forming apparatus, which has a cover 25 for covering a mouth 22 of a main body 21, is shown in FIG. 2. In the heating crucible 20, a vaporized organic substance 24 comes out through a nozzle 25a formed in the cover 25 and is deposited as a film on a substrate. When this style of a heating crucible is used, less of the organic substance 24 is consumed, and a more uniform organic thin film can be deposited on the substrate.

An example of such a heating crucible with a cover is disclosed in Japanese Laid-open Patent No. hei 10-195639. According to the disclosure of this patent, a cover having a smaller diameter than the heating crucible is placed above and close to an organic substance contained in the heating crucible, so as to control the deposition rate with more ease. Many other techniques for improving the nozzle structure of the cover have been suggested.

However, such heating crucibles with covers have the following problems.

As shown in FIG. 2, since a heater 23 for heating organic substances 24 is formed only on the outer circumference of the main body 21 of the heating crucible 20, the temperature of the cover 25, particularly near the nozzle 25a, of the heating crucible 20 is relatively low. As a result, the organic substance 24 is recrystallized near the nozzle 25a while sublimating. The recrystallized organic substance 24 adheres to the inner wall of the cover 25, and finally clogs the nozzle 25a. This clogging phenomenon can be prevented by raising the temperature of the external wall of the main body 21. However, in this case, the organic substance 24 chemically changes during deposition, so that the properties of a resulting device degrade. Therefore, it is detrimental to heat the main body 21 above a particular temperature.

As another solution to the clogging problem, an additional heater can be mounted on the top of the cover 25. In this case, a vacuum chamber where the heating crucible 20 is placed is overheated by the heat emitted upward from the heater, and thus, a heat-resistant member needs to be additionally installed above the cover 25. As a result, the structure of the vacuum chamber becomes complicated. In such a heating crucible with a cover, it is difficult to install a thermocouple, especially inside the heating crucible, to measure the temperature of the heating crucible or the cover.

Furthermore, the heating crucibles described above have the following problems because they utilize heat conducted from the heater.

As an organic substance comes out from the heating crucible by being vaporized or sublimated, and is consumed more and more, a heat conduction area of the heater becomes smaller, so that there is a need to raise the temperature of the heater to vaporize or sublimate a constant amount of organic substance. However, raising the temperature of the heater causes the organic substance to thermally decompose. Especially for organic substances to be deposited as thin films for organic EL devices that vaporize and chemically change at similar temperatures, considerable careful attention is required when controlling the temperature of the heater.

SUMMARY OF THE INVENTION

The present invention provides a heating crucible for use in an organic thin film forming apparatus that prevents the clogging of a nozzle of a cover by an organic substance recrystallized on the inner wall of the cover near the nozzle.

The present invention also provides a heating crucible for use in an organic thin film forming apparatus that has a structure enabling accurate and easy measurement and control of the inner temperature of the heating crucible.

The present invention also provides a heating crucible for use in an organic thin film forming apparatus that is capable of effectively vaporizing or sublimating an organic substance without thermal decomposition.

The present invention also provides a heating crucible for use in an organic thin film forming apparatus that is easy to assemble and disassemble, due to a simple structure having a cover integrated with a heater, and which improves productivity.

Additional aspects and/or advantages of the invention will be set forth in part in the description which follows and, in part, will be obvious from the description, or may be learned by practice of the invention.

In accordance with one aspect of the present invention, there is provided a heating crucible for an organic thin film forming apparatus, the heating crucible comprising: a main body in which to contain an organic substance; a cover provided on the main body, the cover formed of an insulating material and having a nozzle through which a gaseous organic substance comes out from the main body; a cover heater formed as a thin film type on the top surface of the cover; and a body heater heating the main body.

According to other embodiments, the cover may comprise at least one embedded thermocouple. A heat-resistant layer may be further formed on the surface of the cover heater. In this case, a reflective layer may be formed between the cover heater and the heat-resistant layer.

According to still other embodiments, the main body may be formed of an insulating material, and the body heater may be formed as a thin film type on the outer wall of the main body. In this case, each of the cover heater and the body heater may be formed as a single wire pattern laid over the entire top surface of the cover or the entire outer wall of the main body, the single wire pattern having a positive and a negative terminal at respective ends of the single wire pattern. The single wire pattern of each of the cover heater and the body heater may be formed of platinum by printing.

According to still other embodiments, the cover and the main body may be formed of an insulating material having a good heat radiation property, such as aluminum nitride or alumina.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
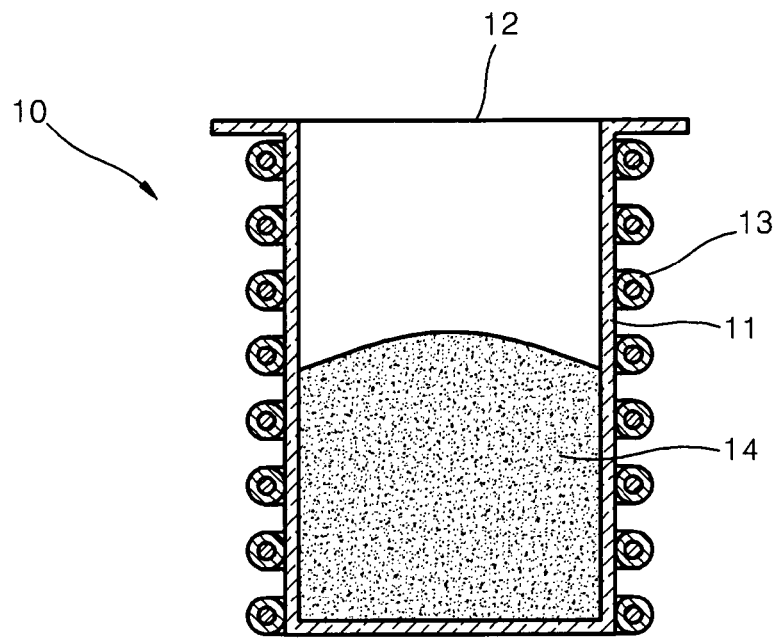
FIG. 1 is a sectional view of a conventional open-style heating crucible for use in an organic thin film forming apparatus.
Figure 2:
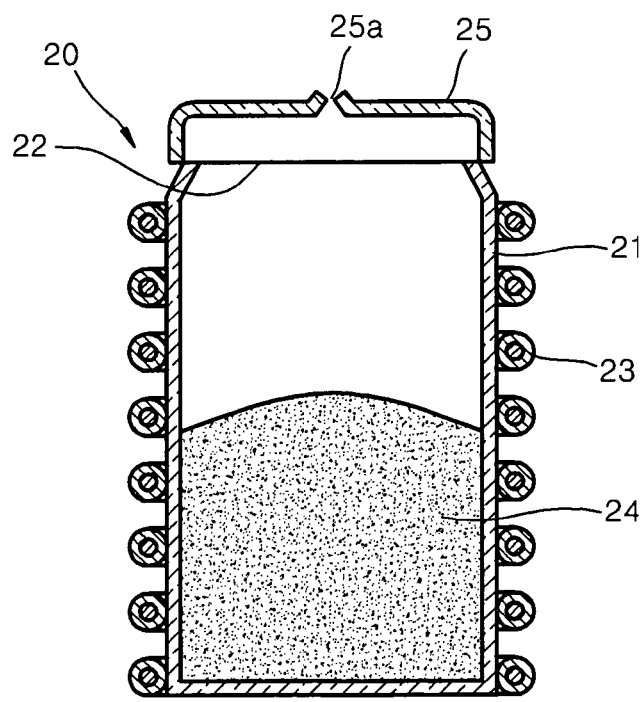
FIG. 2 is a sectional view of a conventional heating crucible with a cover for use in an organic thin film apparatus.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Embodiments of a heating crucible for use in an organic thin film forming apparatus according to the present invention will be described in greater detail.

Figure 3:
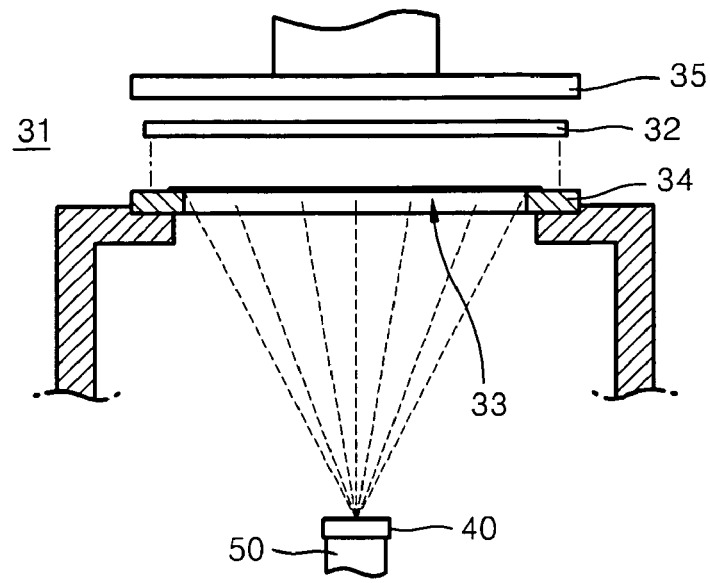
FIG. 3 is a sectional view showing the structure of an organic thin film forming apparatus.

Referring to FIG. 3, an organic thin film forming apparatus includes a vacuum chamber 31. In the vacuum chamber 31, a substrate 32 on which a thin film is to be deposited is placed, and a heating crucible 50 with a cover 40, in which a substance to be deposited as the thin film is contained, is installed below the substrate 32. A mask 33, having a pattern corresponding to a pattern of a desired thin film to be deposited on the substrate 32, is mounted between the substrate 32 and the heating crucible 30, but closer to the substrate 32, while supported by a mask frame 34. A magnet unit 35, installed above the substrate 32, is operated to move the substrate 32 close to the mask 33, which is supported by the mask frame 34.

Figure 4A:
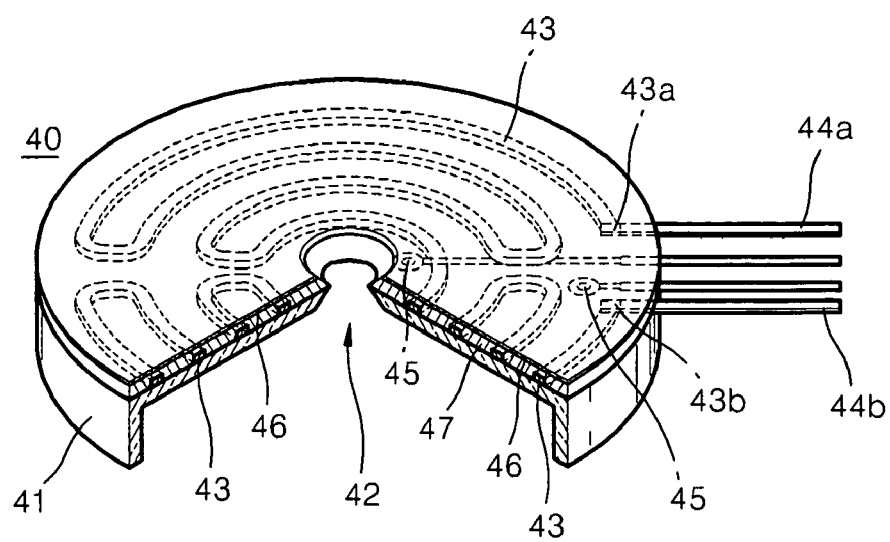
FIG. 4A is a partial cut-away perspective view of a cover of a heating crucible according to an embodiment of the present invention.
Figure 4B:
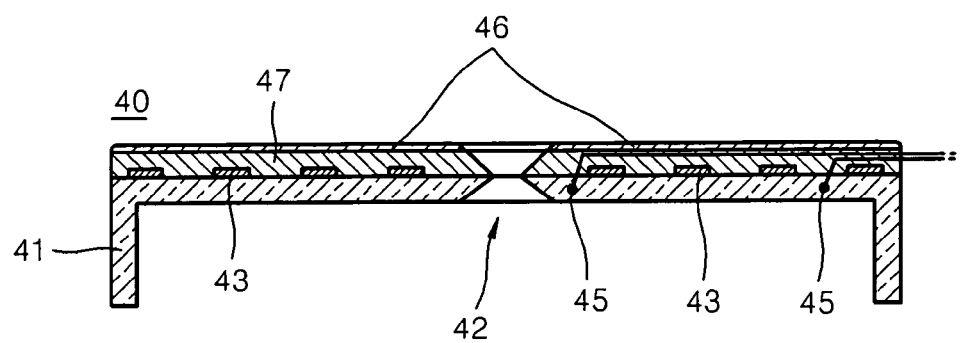
FIGS. 4B and 4C are sectional and plan views of the cover of FIG. 4A.
Figure 4C:
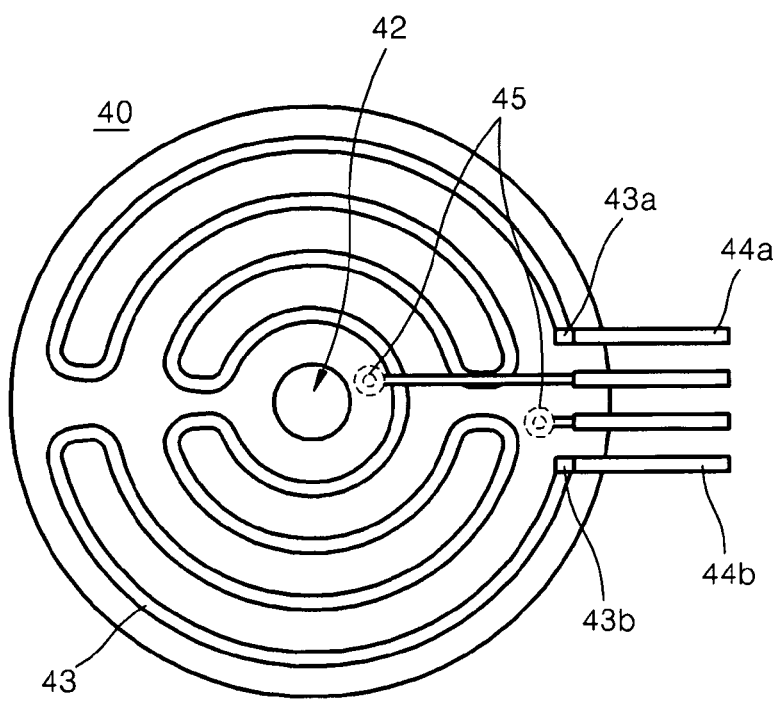
Figure 5:
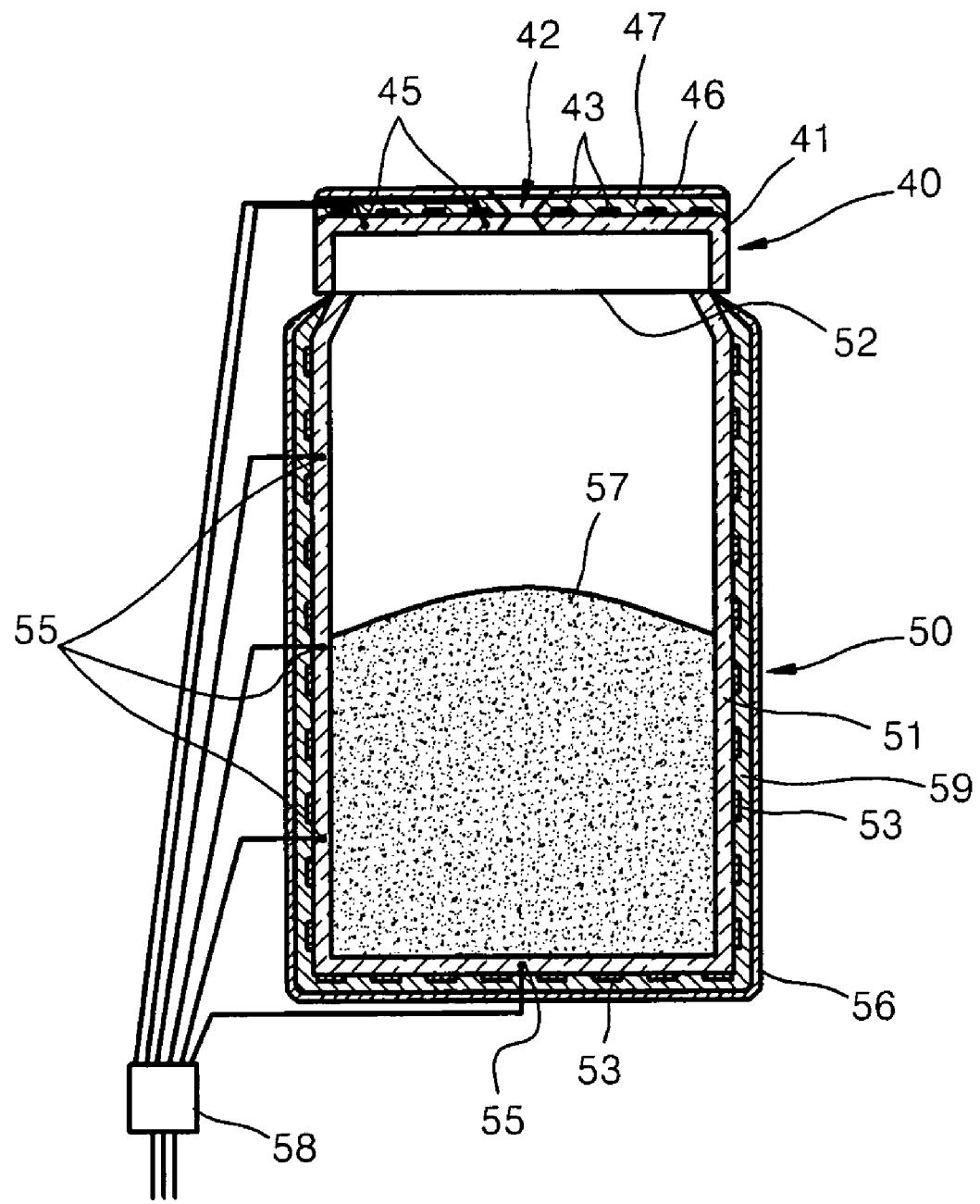
FIG. 5 is a sectional view of a heating crucible for use in an organic thin film forming apparatus according to an embodiment of the present invention.

The heating crucible 50 used in the organic thin film forming apparatus having the above structure has the cover 40. An embodiment of the cover 40 is shown in FIGS. 4A through 4C. The cover 40, which is placed on the heating crucible 50, as shown in FIG. 5, is integrated with a heater formed like a thin layer on the top of the cover 40.

As described above, little heat is transferred from the outer wall of a heating crucible to a nozzle region of a cover through which a gaseous organic substance comes out from the heating crucible, so that there occurs a great difference in temperature between the inside of the heating crucible and the nozzle region. The gaseous organic substance is recrystallized due to the difference in temperature, and adheres to and clogs the nozzle.

In an embodiment of the present invention, in order to solve this problem, a cover heater 43 is integrated into a cover body 41, as shown in FIG. 4A. In particular, a nozzle 42, through which a sublimating or vaporizing organic substance comes out, is formed at the center of the cover 40. The cover 40 includes the cover body 41, formed of an electrically insulating material, the cover heater 43, formed as a thin film type having a predetermined pattern on the top surface of the cover body 41, a heat-resistant layer 46 formed above the cover heater 43, and at least one thermocouple 45 embedded in the cover body 41. As discussed in greater detail below, a reflective layer 47 may be further interposed between the heat-resistant layer 46 and the cover heater 43. If the reflective layer 47 is not provided, the heat-resistant layer 46 is formed on the cover heater 43.

The cover heater 43 has a positive terminal 43a and a negative terminal 43b at both ends, respectively, through which external electricity is supplied to generate heat, and which are connected to external wires 44a and 44b, respectively. The cover heater 43 is formed by coating a material having a predetermined resistance, and capable of generating an electrical current, as a thin layer to form the cover heater 43 as a single-layer cover heater. The cover heater 43 may have a concentric pattern around the nozzle 42, as shown in FIG. 4C. However, any other patterns which can be laid over the entire top surface of the cover 40 can be applied. FIG. 4C is a plan view of the cover 40, in which the heat-resistant layer 46 and the reflective layer 47 are not illustrated in order to show a pattern of the cover heater 43.

The cover heater 43 may be formed of platinum by screen printing. Any other materials and techniques capable of forming a thin-layered cover heater can be applied. For example, the cover heater 43 may be formed by printing a conductive paste containing metal particles and metal oxide on the surface of the cover 40 and sintering the printed conductive paste. Alternatively, a thin graphite layer may be formed on the cover 40 by chemical vapor deposition (CVD).

While the cover heater 43 is formed as a conductive heat generator, the cover body 41 to which the thin-layered cover heater 43 is attached is formed of an electrically insulating material. A suitable electrically insulating material for the cover body 41 includes a thermally conductive ceramic material, for example, ceramic nitrides, such as aluminum nitride, and ceramic carbides, such as silicon carbide.

Suitable materials for the cover body 41 include insulating materials having good heat radiation property. In a conduction heating type cover heater where heat generated by the cover heater 43 is directly transferred to an organic substance by conduction, the organic substance is likely to decompose as a result of the heat conduction. However, this problem of thermal decomposition of the organic substance can be eliminated to some extent when heat generated by the cover heater 43 is transferred to the organic substance by heat radiation rather than heat conduction. Therefore, it is preferable that the cover body 41 is formed of a material having good heat radiation property, even if its thermal conductivity is low. Use of a material having a good heat radiation property improves thermal efficiency. An example of a material having a good heat radiation property is alumina ($Al_2O_3$).

As is more apparent from FIG. 4B, the heat-resistant layer 46, which is formed above the cover heater 43, is formed as a thin film type on the cover body 41. The heat-resistant layer 46 blocks heat generated by the cover heater 43 from being transferred to an external space above the heating crucible 50, i.e., the internal space of the vacuum chamber 31, so that all of the heat generated by the cover heater 43 is transmitted inside the heating crucible 50. In a case where the cover body 41 is formed of a material having a good heat radiation property as described above, a reflective layer 47 may be further interposed between the heat-resistant layer 46 and the cover heater 43. If the reflective layer 47 is not provided, the heat-resistant layer 46 is formed on the cover heater 43.

As shown in FIG. 4B, the nozzle 42 is a convergent-divergent nozzle from which the sublimating or vaporizing organic substance comes out in a diverging pattern as shown in FIG. 3, thereby enabling the assembly of the heating crucible 50 and the cover 40 to produce a diverging pattern of the sublimating or vaporizing organic substance as shown in FIG. 3.

As shown in FIG. 4B, the nozzle 42 extends from a surface of the cover body 41 facing toward the heating crucible 50 (see FIG. 3) to a surface of the heat-resistant layer 46 facing away from the heating crucible 50. An entry opening of the nozzle 42 through which the sublimating or vaporizing organic substance enters the nozzle 42 is flush with the surface of the cover body 41 facing toward the heating crucible 50, and an exit opening of the nozzle 42 through which the sublimating or vaporizing organic substance exits from the nozzle 42 is flush with the surface of the heat-resistant layer 46 facing away from the heating crucible 50. The nozzle 42 converges from the entry opening of the nozzle 42 to a throat of the nozzle 42 at a junction between the cover body 41 and the heat-resistant layer 46, and diverges from the throat of the nozzle 42 to the exit opening of the nozzle 42.

When the cover body 41 is formed of a ceramic material as described above, more than one thermocouple 45 can be embedded in the cover body 41, as shown in FIG. 4B. The thermocouple 45 may be embedded during formation of the cover body 41. Since the thermocouple 45 is integrated into the cover body 41, the inner temperature of the heating crucible 50 can be accurately measured and easily controlled.

The cover 40 of the heating crucible 50 having the structure described above is placed to cover a mouth 52 of the main body 51 of the heating crucible 50. As seen in FIG. 5, a thin-layered body heater may be formed on the outer wall of the main body of the heating crucible 50. The basic configuration of the body heater may be the same as the cover heater 43.

In particular, a main body 51 of the heating crucible 50, in which an organic substance 57 is contained, is formed of an electrically insulating ceramic material, and a body heater 53 having a predetermined pattern may be laid as a thin layer over the outer wall of the main body 51. A method of forming and patterning the body heater 53 may be the same as the cover heater 43 described above to form the body heater 53 as a single-layer body heater, and thus a detailed description thereon is omitted. The body heater 53 may be laid over the bottom of the main body 51, as well as the outer sidewall.

A heat-resistant layer 56 may be formed to surround the body heater 53, formed on the main body 51, so as to prevent heat from being emitted outside the main body 51 and raising the temperature of the vacuum chamber. At least one thermocouple 55 may be embedded in the sidewall, as well as the bottom, of the main body 51.

Like the cover 40, the main body 51 of the heating crucible 50 may be formed of a ceramic nitride or ceramic carbide having good thermal conductivity, and alumina having a good heat radiation property. In a case where the main body 51 is formed of alumina, a reflective layer 59 may be further interposed between the heat-resistant layer 56 and the body heater 53 to improve heat radiation. If the reflective layer 59 is not provided, the heat-resistant layer 56 is formed on the body heater 53.

As described above, since the heating crucible 50 includes a plurality of thermocouples 45 and 55 embedded in the cover body 41 and the main body 51, it is easy to control the inner temperature of the heating crucible 50. The respective thermocouples 45 and 55, of the cover body 41 and the main body 51, are connected to a controller 58, so that the cover heater 43 and the body heater 53 can be controlled by the controller 58.

In a heating crucible according to an embodiment of the present invention having such a structure as described above, in which a thin-layered heater is integrated into each of the cover and the main body of the heating crucible, although the heater has been described in the above embodiment as being a heating wire having a predetermined pattern, the heater may be formed as a heating block by spray coating a heat emitting material. For example, a spray-coated heater may be formed by spray coating a cover body with a heat emitting material and connecting positive and negative terminals to the cover heater, wherein the spray-coated cover heater generates heat as a predetermined voltage is applied to the positive and negative terminals via external wires. In this case, it will be appreciated that a heat-resistant layer is formed over the spray-coated heater, and that at least one thermocouple is embedded in the cover body formed of an electrically insulating ceramic material having a good heat radiation property, such as alumina. The same spray-coated heater can be applied to the main body of a heating crucible according to another embodiment of the present invention.

A heating crucible according to an embodiment of the present invention having any structure described above can be used to deposit various organic thin films for organic EL devices, such as a hole injecting layer, a hole transporting layer, an emissive layer, an electron transporting layer, an electron injecting layer, etc. In addition, such a heating crucible can be used to directly deposit a cathode through which electrons are injected into an organic EL device.

A heating crucible according to the embodiments of the present invention described above provides the following effects.

First, since the entire cover is uniformly heated, clogging of the nozzle by an organic substance recrystallized near the nozzle does not occur, even when deposition of the organic substance is performed for a longer duration.

Second, the use of embedded thermocouples enables accurate measurement and control of temperature.

Third, since a thin-layered heater may be integrated into each of the cover and the main body of the heating crucible, the heating crucible has a higher heating efficiency, and the inner temperature of the heating crucible can be timely and rapidly controlled with more ease.

Fourth, each of the main body and the cover of the heating crucible may be formed as a single body with a heater, a thermocouple and a heat-resistant layer, so it is easy to install the heating crucible in a vacuum chamber and to supply an organic substance into the heating crucible.

Fifth, since the main body and the cover of the heating crucible may be formed of a ceramic material having a good heat radiation property, an organic substance contained in the heating crucible can be effectively vaporized or sublimated without thermal decomposition, so that the overall productivity of organic EL devices is improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A heating crucible for an organic thin film forming apparatus, the heating crucible comprising:
    a main body to contain an organic substance;
    a cover disposed on the main body, the cover being constituted by an insulating material and comprising a nozzle through which a gaseous organic substance comes out from the main body;
    a cover heater disposed on a surface of the cover facing away from the main body, the cover heater being constituted by a thin film type heater;
    a heat-resistant layer disposed so that the cover heater is disposed between the surface of the cover facing away from the main body and the heat-resistant layer;
    a reflective layer disposed between the cover heater and the heat-resistant layer; and
    a body heater disposed on the main body;
    wherein the nozzle extends from a surface of the cover facing toward the main body to a surface of the heat-resistant layer facing away from the main body;
    wherein an entry opening of the nozzle through which the gaseous organic substance enters the nozzle is flush with the surface of the cover facing toward the main body;
    wherein an exit opening of the nozzle through which the gaseous organic substance exits from the nozzle is flush with the surface of the heat-resistant layer facing away from the main body; and
    wherein the nozzle converges from the entry opening to a throat of the nozzle at a junction between the cover and the heat-resistant layer, and diverges from the throat of the nozzle to the exit opening.

* * * * *